US008073023B2

(12) United States Patent
Uchida (10) Patent No.: US 8,073,023 B2
(45) Date of Patent: Dec. 6, 2011

(54) SURFACE EMITTING LASER (75) Inventor: Takeshi Uchida, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 7 days.

(21) Appl. No.: 12/850,550

(22) Filed: Aug. 4, 2010

(65) Prior Publication Data
US 2011/0044363 A1    Feb. 24, 2011

(30) Foreign Application Priority Data

Aug. 19, 2009  (JP) ................... 2009-189712

(51) Int. Cl.
H01S 3/10 (2006.01)
H01S 5/00 (2006.01)
(52) U.S. Cl. .................. 372/21; 372/22; 372/50.124
(58) Field of Classification Search ............. 372/21, 372/22, 50.124
See application file for complete search history.

(56) References Cited

FOREIGN PATENT DOCUMENTS

| JP | 3-34484 A | 2/1991 |
|----|----|----|
| JP | 3-034484 A | 2/1991 |
| JP | 07-335976 A | 12/1995 |
| JP | 2000-277760 A | 10/2000 |
| JP | 2000-332351 A | 11/2000 |
| JP | 2001-274505 A | 10/2001 |
| JP | 2004-198834 A | 7/2004 |

Primary Examiner — Armando Rodriguez (57) ABSTRACT

A surface emitting laser includes a plurality of semiconductor layers including an active layer over a substrate, and emits laser light in a direction perpendicular to the surface of the substrate. The semiconductor layers including the active layer define a resonator that emits laser light having a first wavelength. A wavelength-converting layer is disposed between the substrate and the resonator. The wavelength-converting layer converts the light having the first wavelength into light having a second wavelength that can pass through the substrate.

9 Claims, 5 Drawing Sheets

SURFACE EMITTING LASER

BACKGROUND OF THE INVENTION

1. Field of the Invention

The present invention relates to a surface emitting laser.

2. Description of the Related Art

Conventionally, the light intensity of a semiconductor laser is controlled to a desired level by monitoring the light intensity with a photodetector (PD), and increasing or reducing the current driving the semiconductor laser according to the monitoring result. In an edge emitting laser, light is emitted from two facets thereof. Light from one facet is combined with a lens or a fiber and is used as output light; and light from the other facet enters the photodetector to monitor the light amount.

Unlike the edge emitting lasers, the vertical-cavity surface emitting laser (VCSEL) emits light in a direction perpendicular to the surface of the substrate. See, Japanese Patent Laid-Open No. 07-335976. VCSELs can be easily arranged in a two-dimensional array at a higher density than the edge emitting lasers. By using a high density VCSEL array for electronic photography, high resolution and high speed photography can be achieved.

A general VCSEL, which includes an upper and a lower distributed Bragg reflector (DBR) with a resonator therebetween, emits light in a direction perpendicular to the surface of the substrate. If the amount of light from the VCSEL structure is to be monitored by extracting laser light from the opposite side to the light emitting side, as in the edge emitting lasers, light must be extracted through the substrate to the rear side of the substrate.

Another type of semiconductor laser having a structure different from the conventional VCSEL is proposed by Japanese Patent Laid-Open No. 2000-332351. The type of semiconductor laser proposed by Japanese Patent Laid-Open No. 2000-332351 vertically emits light with a photonic crystal (PhC). Such a laser will be referred to as a PhC surface emitting laser. A PhC surface emitting laser resonates in the horizontal direction, but emits light in the direction perpendicular to the surface of the substrate because of PhC diffraction. The PhC surface emitting laser is different from a VCSEL in structure, but is similar in emitting light in the direction perpendicular to the surface of the substrate. Accordingly, for monitoring light from the PhC surface emitting laser at the substrate side, the light must also be extracted to the rear side of the substrate through the substrate.

Semiconductors absorb light (photons) having a higher energy than their band gaps (by interband transition). For example, GaAs absorbs light having wavelengths of less than 880 nm. The absorption coefficient of this absorption by interband transition is ten times or more larger than that of free electron absorption or intervalence band absorption. Accordingly, the substrate cannot transmit light to the rear surface thereof. Therefore, for example, in surface emitting lasers of 850 nm, 780 nm, or 660 nm formed on a GaAs substrate, light is highly absorbed to the substrate by interband transition in the substrate material, and the light cannot be easily monitored at the substrate side even if the DBR or the like at the substrate side is adjusted to reduce the reflectance.

SUMMARY OF THE INVENTION

The present invention provides a surface emitting laser allowing the monitoring of the light amount at the substrate side thereof even if the substrate can function as an absorbing layer for light having an emission wavelength.

According to an aspect of the present invention, a surface emitting laser includes a plurality of semiconductor layers including an active layer over a substrate, and emits laser light in a direction perpendicular to the surface of the substrate. The semiconductor layers including the active layer define a resonator emitting laser light having a first wavelength. A wavelength-converting layer is disposed between the substrate and the resonator. The wavelength-converting layer converts the light having the first wavelength into light having a second wavelength that can pass through the substrate.

According to embodiments of the present invention, a surface emitting laser allows for the monitoring of the light amount at the substrate side even if the substrate can function as an absorbing layer of light having the emission wavelength.

Further features of the present invention will become apparent to persons having ordinary skill in the art from the following description of exemplary embodiments with reference to the attached drawings.

DESCRIPTION OF THE EMBODIMENTS

Vertical-Cavity Surface Emitting Laser (VCSEL)

In accordance with at least one embodiment of the present invention, a VCSEL includes—stacked onto each other—a substrate; a resonator structure (resonator) stacked over the substrate, having a lower DBR layer, an upper DBR layer, and an active layer between the DBR layers; and a wavelength-converting layer between the substrate and the resonator structure. The wavelength-converting layer absorbs light having an emission wavelength and emits light that can penetrate the substrate. Therefore, light (having a first wavelength) emitted from the resonator structure toward the substrate is converted to light (having a second wavelength) capable of penetrating the substrate by the wavelength-converting layer. Consequently, the amount of the light having the second wavelength can be detected by a light detecting device, such as a photodetector or the like. By providing a structure in which the wavelength-converting layer converts laser light having a first wavelength to light having a second wavelength capable of penetrating the substrate, the amount of light emitted from the resonator structure (resonator) can be monitored by the photodetector disposed at the rear side of the substrate.

Figure 1A:
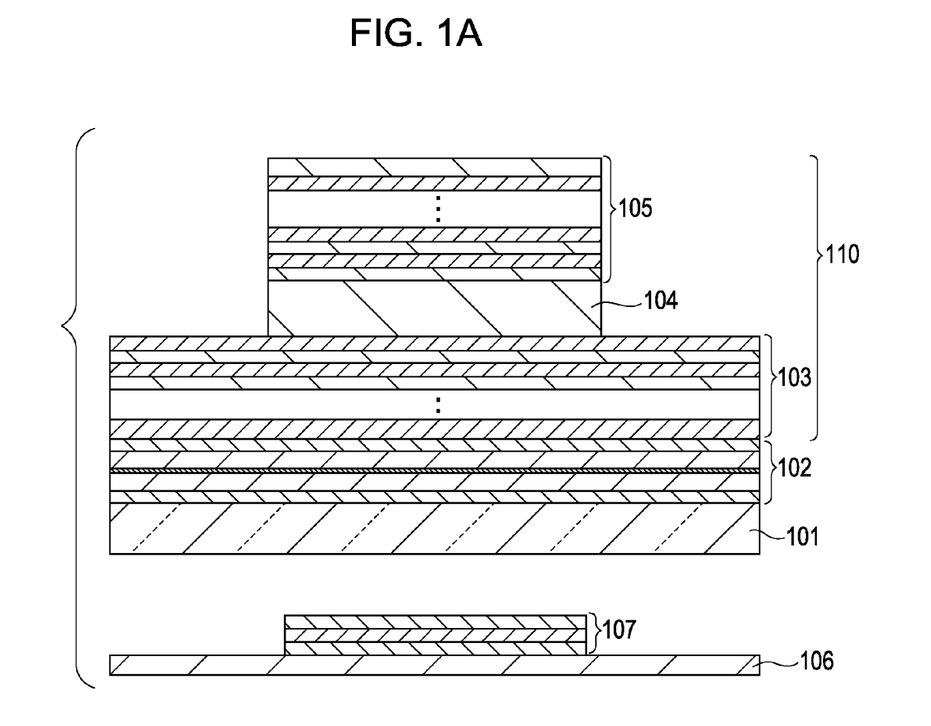
FIGS. 1A and 1B are representations of a VCSEL according to an embodiment of the present invention.

The structure of a VCSEL of an embodiment will be described below with reference to FIGS. 1A and 1B. FIG. 1A shows the structure of layers of the VCSEL. The VCSEL includes a plurality of semiconductor layers including an active layer on a substrate, as shown in FIG. 1A, and emits light in a direction perpendicular to the surface of the substrate. More specifically, a wavelength-converting layer 102 is disposed on the substrate 101, and a resonator structure 110 defining a surface emitting laser is disposed on the wavelength-converting layer 102. The resonator structure 110 includes a lower DBR layer 103 (first DBR layer), an active layer 104 causing stimulated emission, and an upper DBR layer 105 (second DBR layer). Conventionally, the number of layer pairs in the lower DBR layer is set so as to prevent light from leaking through the lower DBR layer to thereby enhance the light use efficiency. In the present embodiment, however, the number of layer pairs in the lower DBR layer 103 is adjusted so that light can enter the wavelength-converting layer 102. Under the substrate 101, a photodetector (light detecting device) 107 is disposed on a Si substrate 106 apart (at a predetermined distance) from the resonator structure 110.

Figure 1B:
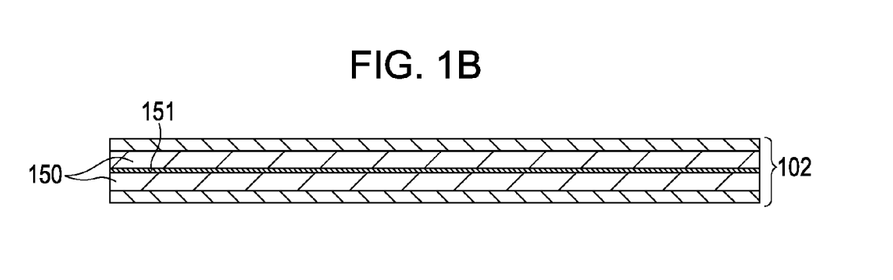

Turning to FIG. 1B, the structure of the wavelength-converting layer 102 will be described in detail. The wavelength-converting layer 102 includes carrier-generating layers 150 absorbing light emitted from the resonator structure 110 or VCSEL, and a light-emitting layer 151 that emits light having a second wavelength towards the substrate. The light having the second wavelength is not absorbed by the substrate. The carrier-generating layer 150 is made of a semiconductor material (first semiconductor material) that absorbs light having the first wavelength in interband absorption. More specifically, the carrier-generating layer 150 can be made of a semiconductor material having a band gap narrower than the photon energy of light having the first wavelength. The light having the first wavelength emitted from the resonator structure 110 is absorbed in the carrier-generating layer 150 in interband absorption to generate many holes and electrons. The electrons and holes are then transferred from the carrier-generating layer 150 to the light-emitting layer 151 having a narrow band gap. Since the potentials of the holes and electrons in the light-emitting layer 151 are lower than those in the carrier-generating layer 150, the electrons and holes generated in the carrier-generating layer 150 are accumulated to the light-emitting layer 151 having a lower potential.

The light-emitting layer 151 is made of a semiconductor material (second semiconductor material) having a band gap narrower than the band gap of substrate 101 on which the crystals of semiconductor layers are grown. Accordingly, the photon energy of light having the second wavelength generated by recombination of the carriers accumulated in the light-emitting layer 151 is lower than the band gap of the substrate. Consequently, interband adsorption does not occur when the substrate transmits light. Therefore, even the substrate 101 has a thickness of about several hundreds of micrometers, the light having the second wavelength can penetrate and pass through the substrate 101.

In the structure of the present embodiment, the number of holes and electrons generated in the carrier-generating layer 150 is increased or reduced according to the intensity of light having the first wavelength, that is, the intensity of the light emitted from the resonator structure 110. Then, the intensity of light having the second wavelength generated in the light-emitting layer 151 is increased or reduced according to the number of holes and electrons. Thus, the intensity of the light emitted from the resonator structure 110 can be known by monitoring the intensity of light having the second wavelength by the photodetector 107 under the substrate 101.

In order to prevent carriers from leaking from the surfaces of the carrier-generating layers 150 not adjoining the light-emitting layer 151, a carrier blocking layer may be provided. The carrier blocking layer can be made of a semiconductor having a larger band gap than the carrier-generating layers 150 so as to act as a potential barrier for both holes and electrons.

Typical wavelength bands that can be used for the VCSEL of the present embodiment and semiconductor layers for the wavelength bands are shown below:
660 nm band
　Substrate: GaAs
　DBR layer: $Al_xGa_{1-x}As/Al_yGa_{1-y}As$ (1>x>y>0.5)
　Active layer: AlGaInP/GaInP multi-quantum well structure
　Carrier-generating layer 150: $Al_xGa_{1-x}As$ (0.3>z>0)
　Light-emitting layer 151: $In_xGa_{1-x}As$ (0.3>x>0.15)
780 nm band
　Substrate: GaAs
　DBR layer: $Al_xGa_{1-x}As/Al_yGa_{1-y}As$ (1>x>y>0.3)
　Active layer: $Al_xGa_{1-x}As/Al_yGa_{1-y}As$ (x>y, y=0.25) multi-quantum well structure
　Carrier-generating layer 150: $Al_xGa_{1-x}As$ (0.2>z>0)
　Light-emitting layer 151: $In_xGa_{1-x}As$ (0.3>x>0.15)
850 nm band
　Substrate: GaAs
　DBR layer: $Al_xGa_{1-x}As/Al_yGa_{1-y}As$ (1>x>y>0.16)
　Active layer: $Al_xGa_{1-x}As/GaAs$ (x>0.25) multi-quantum well structure
　Carrier-generating layer 150: $In_xGa_{1-x}As$ (0.2>x>0)
　Light-emitting layer 151: $In_xGa_{1-x}As(x)$ (0.3>x>0.2)

The above combinations of wavelength bands and semiconductor materials are examples of the wavelength band and material used for a surface emitting laser produced by crystal growth on a GaAs substrate in the present embodiment. The present invention can be applied to other structures including elements made of other materials, such as ZnSe-base materials or GaN-based material, or a structure in which light having the emission wavelength of the laser is absorbed by the band gap of the substrate. For example, in an UV laser including an AlGaN/GaN active layer, light is absorbed at the GaN substrate. In this instance, the carrier-generating layer can be made of a material absorbing light having the emission wavelength, such as GaN, and the light-emitting layer can be made of a material emitting light penetrating the substrate, such as InGaN. The substrate may be worked to form a convex surface, as described in a second embodiment below, or may be provided with such a curved member. Another DBR layer may be provided for the light having the second wavelength emitted from the wavelength-converting layer under the lower DBR layer, as described in a third embodiment below. In such a structure, the additional DBR layer is designed so as to have a higher reflectance for light having the second wavelength than for light having the first wavelength emitted from the surface emitting laser. For example, a low refractive index layer and a high refractive index layer are formed each to an optical thickness of λ/4 for light having the second wavelength.

Photonic Crystal (PhC) Surface Emitting Laser

Figure 5:
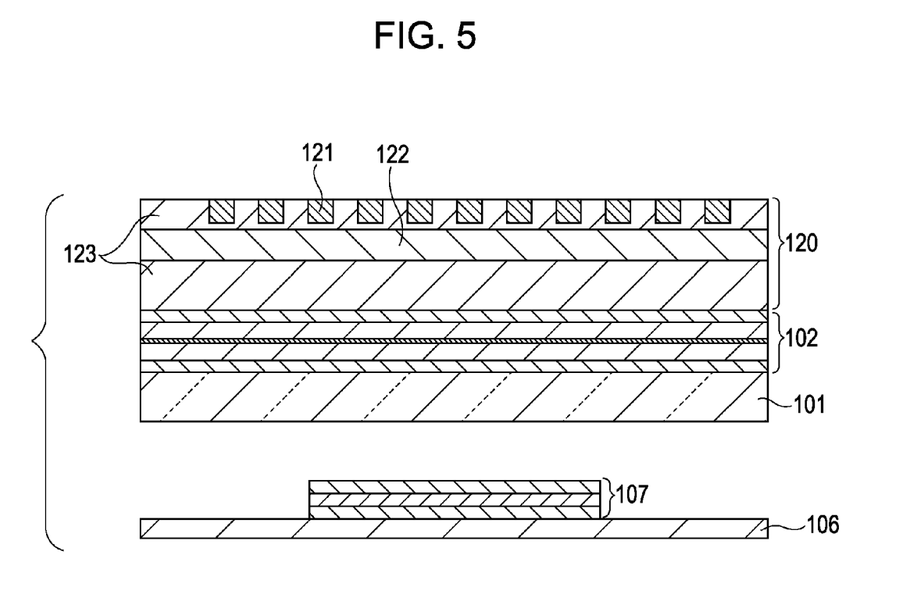
FIG. 5 is a representation of a PhC surface emitting laser according to an embodiment of the present invention.

Referring to FIG. 5, a surface emitting laser including a photonic crystal (PhC) will be described. This surface emitting laser includes the same members as the VCSEL shown in FIG. 1 except that a PhC structure 120 is provided as the resonator instead of the resonator structure 110, as shown in FIG. 5. In FIG. 5, the same members as in FIG. 1 are designated by the same reference numerals as in FIG. 1. In the PhC structure 120 shown in FIG. 5, PhCs having a resonance mode in an in-plane direction parallel to the surface of the substrate are arranged in contact with the active layer. More specifically, the PhC structure 120 includes a core layer 122 including an active layer, clad layers 123 separated by the core layer 122, and a plurality of cylindrical low refractive index portions 121 periodically arranged in a two dimensional manner and acting as PhCs. In such as PhC structure 120, light resonates in a lateral direction (horizontal direction) along an optical waveguide defined by the core layer 122 and the clad layers 123. Part of the resonating light is diffracted at the PhCs and emitted vertically. The laser light emitted from the PhC structure 120 towards the substrate 101 enters the wavelength-converting layer 102. The wavelength-converting layer 102 then emits light having a second wavelength towards the substrate. The light having the second wavelength is not absorbed by the substrate. Instead, the light having the second wavelength passes through the substrate 101 and enters the photodetector 107. Thus, the intensity of the light emitted from the PhC structure or PhC surface emitting laser 120 can be monitored.

For this PhC surface emitting laser, the active layer of the core layer 122 and the wavelength-converting layer 102 can be made of the materials listed for the active layer and the wavelength-converting layer 102 of the resonator structures 110 for the aforementioned wavelength bands. For the clad layers 123, the material listed for the DBR layers of the VCSELs for the aforementioned wavelength bands can be used.

Specific embodiments of the present invention will now be described.

First Embodiment

Figure 2:
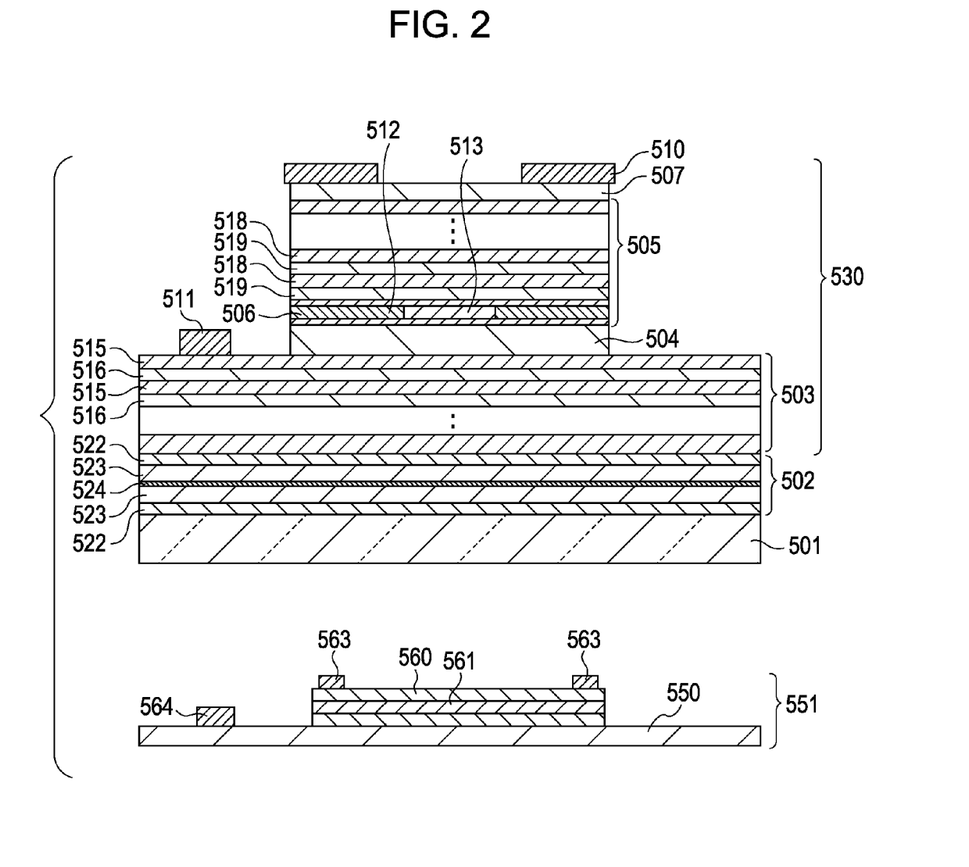
FIG. 2 is a representation of a VCSEL as a red surface emitting laser according to a first embodiment of the present invention.

A first Embodiment will illustrate the structure of a red band VCSEL with reference to FIG. 2. The structure of the present embodiment includes an n-type GaAs substrate 501, a wavelength-converting layer 502, and a resonator structure 530. The wavelength-converting layer 502 includes an AlGaAs layer and an InGaAs layer, as described below. More specifically, the wavelength-converting layer 502 includes 200 nm thick $Al_{0.5}GaAs$ barrier layers 522, 500 nm thick GaAs carrier-generating layers 523 between the barrier layers 522, and an 8 nm thick InGaAs quantum well layer 524. The InGaAs quantum well layer 524 is disposed between the carrier-generating layers 523, and emits light having a wavelength of 1 μm penetrating the substrate 501.

The resonator structure 530 is disposed over the wavelength-converting layer 502. The resonator structure 530 has a lower DBR layer 503 including n-type AlAs layers 515 and $Al_{0.5}GaAs$ layers 516 as the lowermost portion thereof. The lower DBR layer 503 adjoins the wavelength-converting layer 502. On the lower DBR layer 503, a one-wavelength resonator structure 504 is disposed including four $Ga_{0.45}In_{0.55}P$ quantum wells and AlGaInP layers separated by the four $Ga_{0.45}In_{0.55}P$ quantum wells (not shown). An upper DBR layer 505 including p-type $Al_{0.9}GaAs$ layers 518 and $Al_{0.5}GaAs$ layers 519 is disposed on the one-wavelength resonator structure 504. The first $Al_{0.9}GaAs$ layer from the active layer of the upper DBR layer 505 is divided by a 30 nm thick $Al_{0.98}GaAs$ layer 506. Also, a highly doped p-type GaAs layer 507 is formed to a thickness of 10 nm on the upper DBR layer 505. The highly doped GaAs layer 507 has a p-side electrode 510 thereon with an electrical contact.

On the lower DBR layer 503, an n-side electrode 511 is disposed with an electrical contact. The device operates by applying a voltage between the p-side electrode 510 and the n-side electrode 511. The $Al_{0.98}GaAs$ layer 506 is oxidized from lateral directions in an element working step, and is divided into oxidized regions 512 and a non-oxidized region 513. The number of repetitions of layers is 45 in the lower DBR layer 503, and 36 in the upper DBR layer 505.

The carrier-generating layers 523 of the wavelength-converting layer 502 are separated by the InGaAs quantum well layer 524, and have a thickness of 500 nm each, or 1 μm in total. Such a thickness of the carrier-generating layers 523 is required to absorb about 90% of the light having an emission wavelength of 680 nm of the resonator structure 530. In addition, a carrier blocking layer 522 is provided. The carrier blocking layer 522 is made of $Al_{0.5}GaAs$ having a larger band gap than GaAs to prevent the leakage of light emitted from the carrier-generating layer 523. Each layer of the lower DBR layer 503 and the upper DBR layer 505 of the surface emitting laser is designed so that the thickness is ¼ of the wavelength of light in the material of the layer.

A photodetector 551 is also provided under the VCSEL substrate 501. The photodetector 551 includes a p-type layer 560, an i-type layer 561, n-type substrate 550, and electrodes 563 and 564. The electrodes 563 and 564 are connected to an automatic power control (APC) circuit (not shown) to control the current driving the resonator structure 530.

A method for manufacturing the device of the present embodiment will now be described. First, for the VCSEL substrate side, the semiconductor layers 502, 503, 504, 505, 506 and 507 are formed on the substrate 501 by metal organic chemical vapor deposition (MOCVD) or molecular beam epitaxy (MBE). The layers from the top to the resonator structure 504 are partially removed to form a columnar shape of about 30 μm in diameter by semiconductor lithography and conventional semiconductor etching. The $Al_{0.98}Ga_{0.02}As$ layer 506 is oxidized from both sides in an atmosphere of steam of about 450° C. In this instance, oxidized portions 512 in which current and light are to be confined and a non-oxidized portion 513 are formed by controlling the oxidation time. The oxidation time is controlled so that the middle portion, or non-oxidized portion 513, has a diameter of about 5 μm. Subsequently, the p-side electrode 510 is formed by vacuum vapor deposition and lithography. The p-side electrode 510 has a circular window for extraction. Then, the n-side electrode 511 is formed on part of the DBR layer 503 exposed by forming the mesa form (columnar shape). In order to ensure good electrical characteristics, the electrodes and the semiconductor layers are alloyed in a high-temperature nitrogen atmosphere. Subsequently, an antireflection film for the wavelength of the light emitted in the wavelength-converting layer 502 is provided on the rear surface of the VCSEL substrate 501 that have been subjected to mirror polishing. Thus the element on the VCSEL substrate is completed.

For the Si substrate side, first, an i-type layer 561 is formed by diffusing a p-type dopant into an n-Si substrate 550 to the same extent as the concentration of the n-type dopant. Then, a high-concentration p-type dopant is diffused into the upper portion of the i-type layer to form a p-type layer 560. Undesired portions of the resulting structure are removed by photolithography and dry etching so that the p-type layer 560 and the i-type layer 561 remain in a mesa shape. Then, the upper electrode 563 is formed by vapor deposition through a lift-off mask formed of a photoresist by photolithography, and undesired metal and the photoresist are removed together by a lift-off method. In the same manner, the electrode 564 is formed on the Si substrate 550. Thus, the element on the Si substrate 550 is completed.

After both the VCSEL substrate side and the Si substrate side are completed, the light-emitting portion of the VCSEL substrate side and the light-receiving portion of the photodetector 551 are aligned in the vertical direction, and the substrates are secured to complete the device.

Although the photodetector 551 is made of Si material in the present embodiment, other materials such as GaAs-based material may be used. In order to prevent a surface current flowing at the side wall of the mesa shape after working into the mesa shape, the i-type layer 561 near the side wall of the mesa shape may be subjected to ion implantation. A protective film may be provided at the surface and the side wall of the mesa shape to prevent changes in material quality with time.

Although the present embodiment illustrates a 660-nm-band VCSEL on a GaAs substrate as a VCSEL of a wavelength band whose light is absorbed by the substrate, VCSELs of other wavelength bands, such as 780 nm or 850 nm, can also produce the same effect. The AlAs layer of the DBR layer 503 in the present embodiment may contain AlGaAs. The $Al_{0.5}GaAs$ layer of the present embodiment contains 50% or more of Al, and may be, for example, $Al_{0.6}GaAs$. An insulator may be provided at the side of the resonator structure 504 and the upper DBR (p-DBR) layer 505 so as to surround them. A conductor line may be provided on the insulator for electrical connection with the p-side electrode 510. An insulating film protecting the highly doped GaAs layer 507 may be provided inside the p-type electrode 510 on the highly doped GaAs layer 507. In order to reduce the light absorption, the highly doped GaAs layer 507 may be removed after the completion of the device, and then an insulating film may be provided to protect the upper DBR layer 505.

A light amount control circuit for automatic power control (APC) may be provided on the same Si substrate as the photodetector or on another semiconductor substrate, and the surface emitting laser, the photodetector, and the control circuit may be integrated into a module. The module can be mounted in a package, including an light amount control circuit. Although the present embodiment uses the VCSEL and the photodetector in a pair, VCSEL's and photodetectors are arranged in a VCSEL array.

In this structure, light from the VCSEL's can be monitored by the respective photodetectors individually. Accordingly, the respective VCSEL's can be fed back all the time.

Second Embodiment

Figure 3:
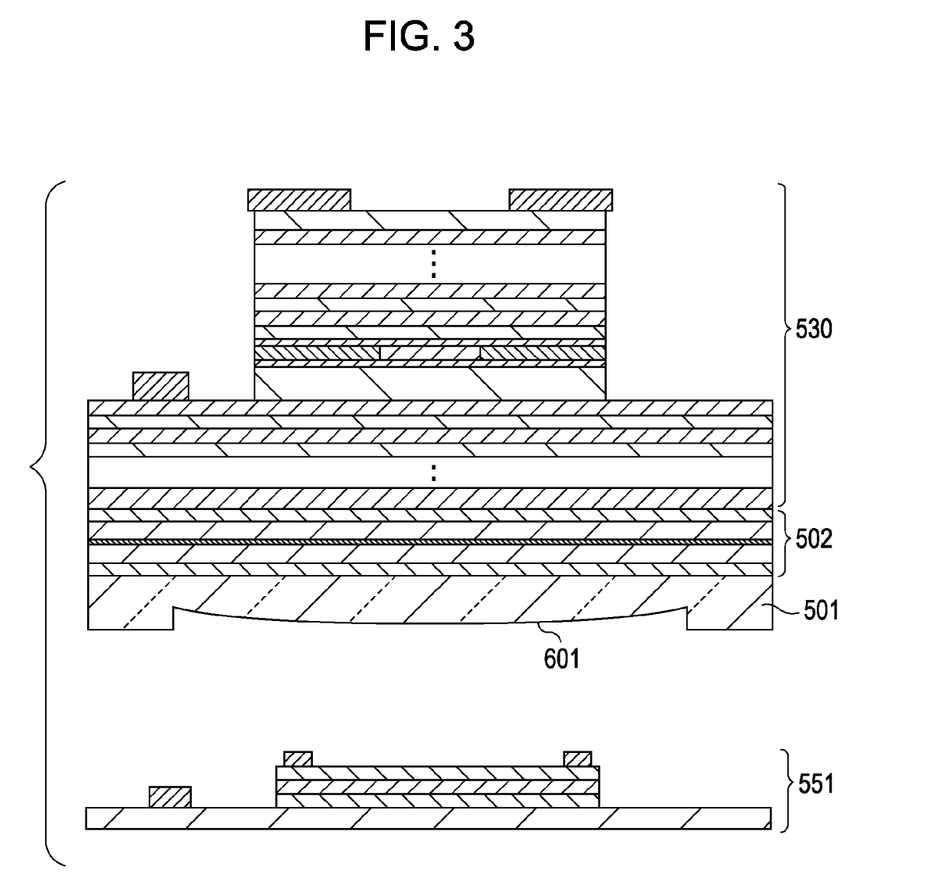
FIG. 3 is a representation of a VCSEL as a red surface emitting laser according to a second embodiment of the present invention.

A device having a different structure from the device of the first embodiment will be described as a second embodiment with reference to FIG. 3. The device of the second embodiment includes a substrate 501, a wavelength-converting layer 502, a resonator structure 530, and a photodetector (light detecting device) 551. In FIG. 3, the same members as in the first embodiment are designated by the same reference numerals. The present embodiment is different from the first embodiment in that the substrate 501 has a curved surface in a convex shape (hereinafter referred to as microlens) 601. The microlens 601 condenses the light generated from the wavelength-converting layer 502 to the photodetector 551. The function of the microlens 601 and advantages of the present embodiment will be described below.

In the known method for monitoring light emitted from a semiconductor laser, laser light extracted from a laser resonator structure propagates in a space with a small spread. On the other hand, light generated in the wavelength-converting layer 502 of the second embodiment is incoherent light, and can spread widely in the vertical direction towards the photodetector 551 and oblique directions. Consequently, the ratio of light that enters the photodetector 551 to the light emitted from the wavelength-converting layer 502 is lower than in the conventional case where laser light is directly monitored. Consequently, the current extracted as light intensity signals from the photodetector 551 is reduced to degrade the signal-to-noise (S/N) ratio. Accordingly, in the present embodiment, a microlens 601 is provided at the rear surface of the VCSEL substrate so that light propagating in oblique directions is focused to the photodetector 551. Thus, the intensity of light entering the photodetector 551 is enhanced to increase the S/N ratio.

A method for manufacturing the device of the present embodiment will now be described. In the present embodiment, the wavelength-converting layer 502 and the resonator structure 530 are formed by crystal growth, and then the microlens 601 is formed. Subsequently, the portions of layers formed by crystal growth are worked in the same manner as in the first embodiment. Since the work on the crystal growth layers is performed in the same manner as in the first embodiment, steps up to the step of forming the microlens 601 will be described below. First, layers of the wavelength-converting layer 502 and the resonator structure 530 are formed by crystal growth, such as MOCVD or MBE. Then, the rear surface of the GaAs substrate 501 is polished to adjust the thickness and makes the surface smooth. Then, a $SiO_2$ layer is deposited on the mirror-finished rear surface, and is formed into a circular pattern forming a frame of the microlens 601 by photolithography. The substrate is immersed in an aqueous solution containing HBr and hydrogen peroxide water for a predetermined period with the other surfaces including the crystal growth faces protected. Consequently, the inside of the pattern is etched into a lens shape, thus forming a microlens 601. This process takes advantage of slow HBr diffusion. Since the $SiO_2$ circular pattern consumes HBr in a small amount at the edge of the pattern, and in a large amount in the region near the center of the pattern, the HBr concentration around the center is reduced to reduce the etching speed. Consequently, the outer portion is etched more to form a convex shape. The microlens 601 is thus formed.

After the formation of the microlens 601, the portion intended for the surface emitting laser is worked with the lens surface protected, in the same manner as in the first embodiment. This step is performed in the same manner as in the first embodiment, and the description is omitted. The photodetector 551 is formed on the Si substrate in the same manner as in the first embodiment, and the description is omitted.

After working the VCSEL substrate side and the Si substrate side, the VCSEL substrate and the Si substrate are respectively secured as well.

In the present embodiment, the photodetector 551 is secured at a position to which the microlens 601 condenses light. Accordingly, the distance between the GaAs substrate and the Si substrate must be adjusted appropriately. Although the microlens is formed by working the GaAs substrate 501 in the present embodiment, the microlens may be formed in another substrate of, for example, glass and is disposed between the VCSEL substrate and the Si substrate to focus light. The shape of the lens is not necessarily convex, and a Fresnel lens or a GRIN lens may be formed.

Third Embodiment

Figure 4:
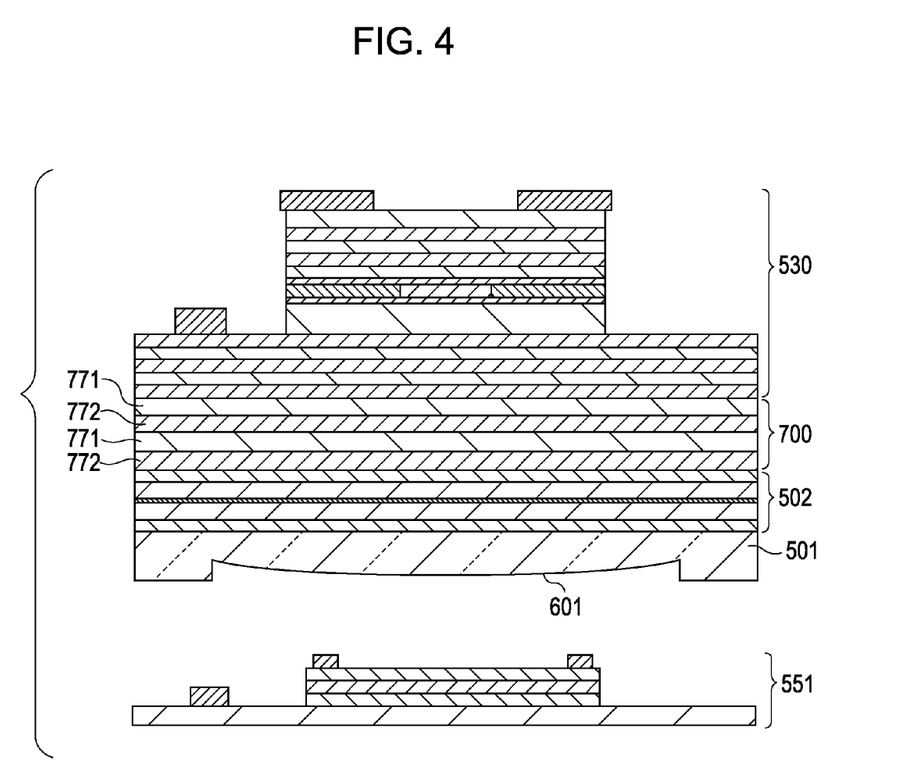
FIG. 4 is a representation of a VCSEL as a red surface emitting laser according to a third embodiment of the present invention.

Another VCSEL structure different from the VCSEL structure of the second embodiment will be described as a third embodiment with reference to FIG. 4. The structure of the present embodiment is different from the structure of the second embodiment in that a DBR layer 700 (third DBR layer) is disposed between the wavelength-converting layer 502 and the resonator structure 530. This DBR layer 700 reflects light having a wavelength of light emitted from the wavelength-converting layer 502. In FIG. 4, the same members as in the first and the second embodiment are designated by the same reference numerals.

The DBR layer 700 in the present embodiment includes $Al_{0.9}GaAs$ low refractive index layers 772 and $Al_{0.5}GaAs$ high refractive index layers 771. The thicknesses of the low refractive index layer 772 and the high refractive index layer 771 are ¼ of the wavelength in the respective materials of light having an emission wavelength of 1 μm of the wavelength-converting layer 502.

Since the light emitted from the wavelength-converting layer 502 is incoherent light, as described in the second embodiment, the light from the wavelength-converting layer 502 is emitted not only downward to the photodetector 551, but also in the direction toward the resonator structure 530. Therefore, the intensity of light entering the photodetector is reduced to reduce the S/N ratio in comparison with the case where laser light is directly monitored, even if the wavelength-converting layer 502 emits light with the same intensity. Accordingly, in the present embodiment, the DBR layer 700 is provided so that light components emitted from the wavelength-converting layer 502 to the resonator structure 530 are reflected to the photodetector 551. Thus, the intensity of light entering the photodetector 551 is enhanced to increase the S/N ratio.

Since the manufacturing process of the present embodiment is substantially the same as in the above embodiment, except that the DBR layer 700 is grown in the step of crystal growth, it is omitted. Although the present embodiment uses a microlens 601 to enhance the efficiency of optical coupling, it is not limited to this form. For example, only the DBR layer 700 may be provided without using the microlens 601. In this instance as well, the efficiency of optical coupling of reflection light from the DBR layer 700 to the photodetector 551 is increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-189712 filed Aug. 19, 2009, which is hereby incorporated by reference herein in its entirety.

What is claimed is:

1. A surface emitting laser comprising:
   a substrate;
   a resonator disposed over the substrate, including a plurality of semiconductor layers including an active layer, the resonator being configured to emit light having a first wavelength; and
   a wavelength-converting layer disposed between the substrate and the resonator, the wavelength-converting layer being configured to convert the laser light having the first wavelength into light having a second wavelength that can pass through the substrate.

2. The surface emitting laser according to claim 1, wherein the wavelength-converting layer includes a carrier-generating layer made of a first semiconductor material configured to absorb the light having the first wavelength in interband absorption and a light-emitting layer made of a second semiconductor material having a band gap narrower than a band gap of the substrate.

3. The surface emitting laser according to claim 2, wherein the carrier-generating layer includes an AlGaAs layer, and the light-emitting layer includes an InGaAs layer.

4. The surface emitting laser according to claim 1, wherein the resonator includes a lower distributed Bragg reflector layer and an upper distributed Bragg reflector layer with the active layer therebetween.

5. The surface emitting laser according to claim 4, further comprising a third distributed Bragg reflector layer between the resonator and the wavelength-converting layer, the third distributed Bragg reflector layer being configured to reflect the light emitted from the wavelength-converting layer.

6. The surface emitting laser according to claim 1, wherein the resonator includes photonic crystals having a resonance mode in an in-plane direction parallel to the surface of the substrate, the photonic crystals being arranged in contact with the active layer.

7. The surface emitting laser according to claim 1, wherein the substrate has a lower surface curved in a convex shape.

8. The surface emitting laser according to claim 1, further comprising a light detecting device disposed near a rear surface of the substrate, and configured to detect the light having the second wavelength.

9. A surface emitting laser comprising:
   a substrate;
   a resonator disposed over the substrate and including a first DBR layer, a second DBR layer and an active layer therebetween, wherein the resonator is configured to emit light having a first wavelength; and
   a wavelength-converting layer configured to convert the light having the first wavelength into light having a second wavelength,
   wherein the wavelength-converting layer is disposed between the substrate and the resonator, and
   wherein the light having the second wavelength passes through the substrate.

* * * * *